(12) United States Patent
Ruff et al.

(10) Patent No.: US 8,052,244 B2
(45) Date of Patent: Nov. 8, 2011

(54) MOVEABLE SENSOR ARRAY AND METHOD OF DETECTING LOCATION OF CALIBRATION FAULT

(75) Inventors: David Norman Ruff, Sherwood, OR (US); Cary Eric Sjolander, Tigard, OR (US); Scott J. Phillips, West Henrietta, NY (US); Kenneth R. Ossman, Macedon, NY (US); Barry Daniel Reeves, Lake Oswego, OR (US)

(73) Assignee: Xerox Corporation, Norwalk, CT (US)

( * ) Notice: Subject to any disclaimer, the term of this patent is extended or adjusted under 35 U.S.C. 154(b) by 399 days.

(21) Appl. No.: 12/394,807

(22) Filed: Feb. 27, 2009

(65) Prior Publication Data

US 2010/0219328 A1  Sep. 2, 2010

(51) Int. Cl.
*B41J 29/38* (2006.01)
*B41J 29/393* (2006.01)

(52) U.S. Cl. .................. 347/19; 347/5; 347/16
(58) Field of Classification Search ............. 347/19, 347/5, 16; 356/320
See application file for complete search history.

(56) References Cited

U.S. PATENT DOCUMENTS

| | | | |
|---|---|---|---|
| 4,435,674 A * | 3/1984 | Hevenor et al. | 318/640 |
| 7,309,118 B2 | 12/2007 | Mizes et al. | |
| 7,427,118 B2 | 9/2008 | Mizes et al. | |
| 2003/0132982 A1 | 7/2003 | Tandon et al. | |
| 2003/0189161 A1 | 10/2003 | Perregaux | |
| 2005/0286742 A1 | 12/2005 | Rasmussen et al. | |
| 2006/0222387 A1 | 10/2006 | Burry et al. | |
| 2006/0244651 A1 | 11/2006 | Hosier | |
| 2007/0003109 A1 | 1/2007 | Wu et al. | |
| 2007/0003302 A1 | 1/2007 | Mizes | |
| 2007/0252861 A1 * | 11/2007 | Wu et al. | 347/19 |

* cited by examiner

*Primary Examiner* — Jason Uhlenhake
(74) *Attorney, Agent, or Firm* — Maginot, Moore & Beck LLP (57) ABSTRACT

A printing device comprises a print head, imaging member, and a moveable sensor array. The print head is configured to deliver marking material to the imaging member as it moves in a process direction. The linear sensor array comprises a plurality of photo sensors configured to scan the imaging member. The photo detectors of the linear sensor array define a sensor axis that is substantially perpendicular to the process direction. The linear sensor array is configured to move along the sensor axis between a first position where the sensor array scans one portion of the imaging member and a second position where the sensor array scans another portion of the imaging member. If a fault is detected during calibration of the sensor array, the moveable sensor array may be used to determine whether the source of the fault rests with the imaging member or the sensor array.

14 Claims, 8 Drawing Sheets

MOVEABLE SENSOR ARRAY AND METHOD OF DETECTING LOCATION OF CALIBRATION FAULT

FIELD

The embodiments disclosed herein relate to the field of printing and specifically to a printing device having a moveable image sensor array and related method for detecting a fault location when the sensor array is calibrated.

BACKGROUND

Many printing devices include sensor arrays that are used for evaluating print quality within a printer and to detect print quality defects. Examples of such sensor arrays and related systems are disclosed in U.S. Pat. Nos. 7,309,118 and 7,427,118, the contents of which are incorporated herein by reference. In such systems the sensor array is typically of sufficient size to scan the full width of the imaging device used to impart the test image to a print media.

Figure 8:
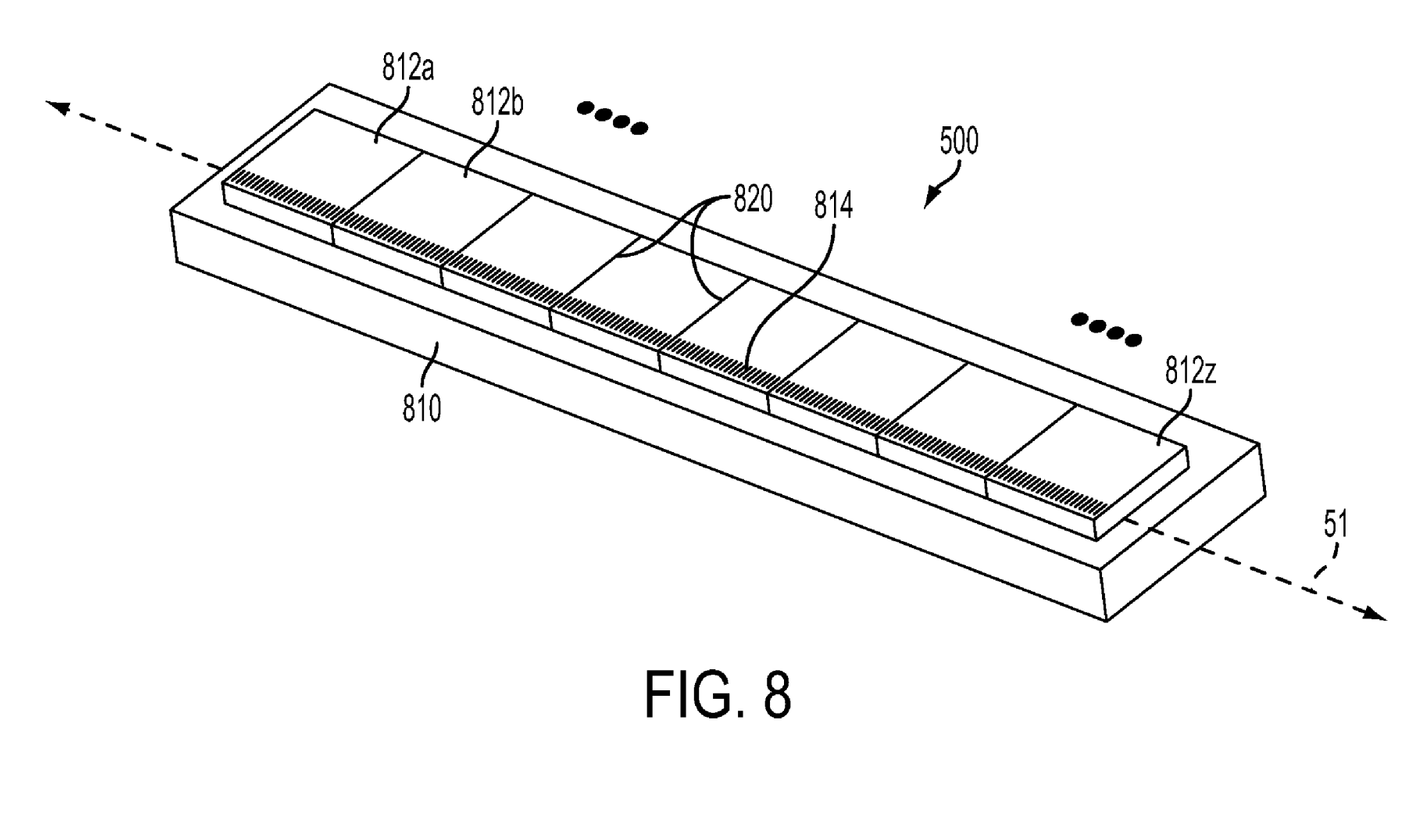
FIG. 8 shows an embodiment of a standard eight and a half inch contact image sensor array for use with the printing system of FIG. 1.

Image sensors used for scanning images in printing devices typically have a row or linear array of photosensors together with suitable supporting circuitry integrated onto a silicon chip. Usually, a sensor is used to scan line by line across the width of a document or other target with the target being moved or stepped lengthwise in synchronism therewith. One example of a linear sensor array is shown in FIG. 8. FIG. 8 shows various portions of an imaging scanner array 50, in which a substrate 810 has a plurality of silicon chips 812*a*, 812*b*, . . . 812*z* assembled end-to-end and mounted thereon. Also defined on each chip 812*a*, 812*b*, . . . 812*z* is a set of photosensors 814 (also referred to herein as "photo detectors"). These structures may be, by way of example and not limitation, photosensors in a charge coupled device, photogates, CMOS photodiodes, amorphous silicon or transparent electrode MOS type photosites. On each chip 812 there is provided a large number (such as 250 or more) photosensors 814, which are separated by a largely consistent gap between the centers of adjacent photosensors within a chip. The photosensors 814 of the sensor array 50 are substantially aligned along an axis 51 of the sensor array. The photosensors are finely spaced along the axis 51, such as 600 to the inch on each chip.

In a typical printing machine with a sensor array, the plurality of small photosensors extends the full width of an original document or other target, such as a sensor array of 11 inches capable of extending across an 11"×17" sheet of paper. When the original document or other target moves past the linear array, each of the photosensors converts reflected light from the original image into electrical signals. The motion of the original image perpendicular to the linear array causes a sequence of signals to be output from each photosensor, which can be converted into digital data.

Printing machines configured to accept relatively large sheets of paper typically require longer sensor arrays in order to scan printed images. As sensor arrays become longer, they also become more expensive. One reason for this is because of the increased number of photosensors required in longer sensor arrays. Of course, when more expensive sensor arrays are required, the cost of producing the printing machine is increased.

When the sensor array is used for detecting print quality defects, the sensor array is typically first calibrated against a blank target. Thereafter, a test image is placed on the target with marking material and the sensor array is used to evaluate the print quality of the test image. However, when a sensor array is used for this purpose, there is a risk that contamination may exist on the unmarked calibration target or on the surface of the sensor itself. There is also a possibility that one or more photosensors of the sensor array may be defective during the calibration. Contamination and/or defective photosensors will distort expected readings during calibration such that the sensor readings fall outside of a defined limit. When this happens, a calibration failure results, and the image sensor can not properly evaluate the test image in subsequent scans.

In view of the foregoing, it would be desirable to provide a printing device having a sensor array of reduced size and reduced cost. It would also be advantageous to provide a printing device with such a sensor array where the printing device is capable of identifying a fault location when the sensor array is calibrated in the printing device.

SUMMARY

A printing device comprises a print head and a moveable sensor array. The print head is configured to deliver marking material to a target such as an imaging member as it moves in a process direction. The linear sensor array comprises a plurality of photo sensors configured to scan the target. The photo detectors of the linear sensor array define a sensor axis that is substantially perpendicular to the process direction and substantially parallel to the surface of the target. The linear sensor array is configured to move along the sensor axis between a first position where the sensor array scans one portion of the target and a second position where the sensor array scans another portion of the target.

In at least one embodiment, the printing device with a moveable sensor array provides for a method of determining a source of a fault during calibration of the sensor array. The method comprises performing a first calibration of a sensor array relative to a reference member, such as an unmarked imaging member, with the sensor array in a first position. If a fault is detected during the first calibration of the sensor array, the sensor array is moved along the sensor axis from the first position to a second position. A second calibration of the sensor array relative to the reference member is then performed with the sensor array in the second position. A comparison is then made between the first calibration results and the second calibration results. Based on this comparison, a determination is made whether the source of the fault rests with the imaging member or the sensor array.

The above described features and advantages, as well as others, will become more readily apparent to those of ordinary skill in the art by reference to the following detailed description and accompanying drawings. While it would be desirable to provide a printing system and method that provides one or more of these or other advantageous features as may be apparent to those reviewing this disclosure, the teachings disclosed herein extend to those embodiments which fall within the scope of the appended claims, regardless of whether they include or accomplish one or more of the advantages or features mentioned herein.

DESCRIPTION

Figure 1:
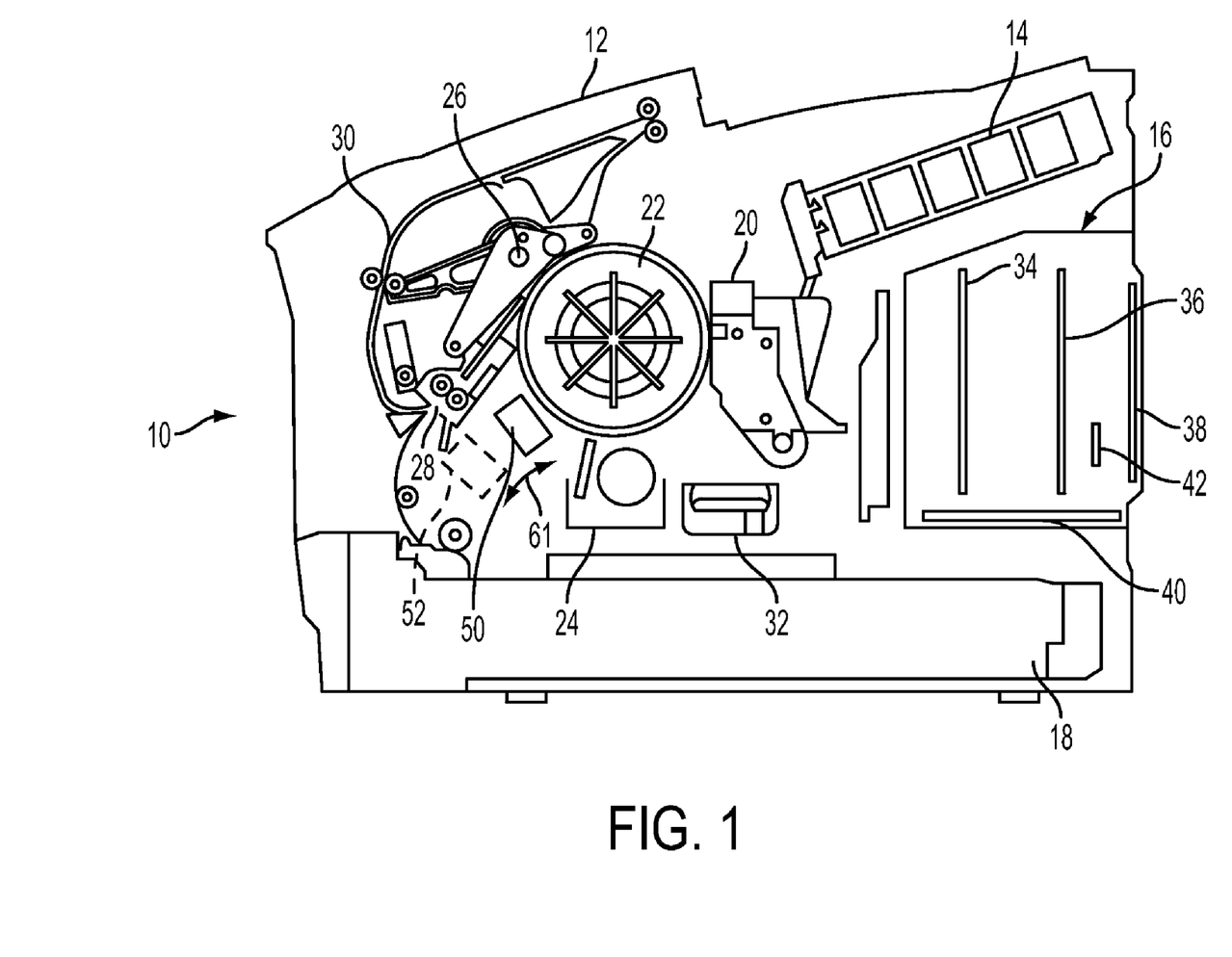
FIG. 1 is an elevational view of representing the components of a printing system including a moveable sensor array, imaging member and print head.

Referring to FIG. 1, there is shown a perspective view of an ink printer 10 that implements a moveable sensor array. The reader should understand that the embodiment discussed herein may be implemented in many alternate forms and variations. In addition, any suitable size, shape or type of elements or materials may be used. Furthermore, the word "printer", "printing device" or "printing system" as used herein encompasses any apparatus, such as a digital copier, inkjet printer, bookmaking machine, facsimile machine, multi-function machine, etc. which performs a print outputting function for any purpose. The term "marking material" as used herein encompasses any colorant or other material used to mark on paper or other media. Examples of marking material include inks, toner particles, pigments, and dyes.

FIG. 1 shows an elevational side view of various components of the ink printer 10 positioned within a housing 12. The ink printer 10 may include an ink loading subsystem 14, an electronics module 16, a paper/media tray 18, a print head 20, an intermediate imaging member 22, a drum maintenance subsystem 24, a transfer subsystem 26, a paper pre-heater 28, a duplex print path 30, an ink waste tray 32, and a moveable image sensor array 50. In brief, solid ink sticks are loaded into ink loader 14 through which they travel to a melt plate (not shown). At the melt plate, the ink stick is melted and the liquid ink is diverted to a reservoir in the print head 20. The ink is ejected by piezoelectric elements through apertures in chemically etched stainless plates to form an image on the intermediate imaging member 22 as the member rotates. An intermediate imaging member heater is controlled by a controller to maintain the imaging member within an optimal temperature range for generating an ink image and transferring it to a sheet of recording media. A sheet of recording media is removed from the paper/media tray 18 and directed into the paper pre-heater 28 so the sheet of recording media is heated to a more optimal temperature for receiving the ink image. A synchronizer delivers the sheet of the recording media so its movement between the transfer roller in the transfer subsystem 26 and the intermediate image member 22 is coordinated for the transfer of the image from the imaging member to the sheet of recording media. The image sensor array 40 is used to scan the imaging member 22 during calibration and image evaluation procedures. The image sensor array 50 is moveable as indicated by arrow 61 between a scan position which is closer to the imaging member 22 and a shielded position further removed from the imaging member 22. In FIG. 1, the image sensor array 50 is shown in solid lines in the scan position and in dotted lines 52 in the shielded position.

The operations of the ink printer 10 are controlled by the electronics module 16. The electronics module 16 includes a power supply 34, a main board 36 with a controller, memory, and interface components (not shown), a hard drive 38, a power control board 40, and a configuration card 42. The power supply 34 generates various power levels for the various components and subsystems of the ink printer 10. The power control board 40 regulates these power levels. The configuration card contains data in nonvolatile memory that defines the various operating parameters and configurations for the components and subsystems of the ink printer 10. The hard drive 38 stores data used for operating the ink printer and software modules that may be loaded and executed in the memory on the main card 36. The main board 36 includes the controller that operates the ink printer 10 in accordance with the operating program executing in the memory of the main board 36. The controller receives signals from the various components and subsystems of the ink printer 10 through interface components on the main board 36. The controller also generates control signals that are delivered to the components and subsystems through the interface components. These control signals, for example, drive the piezoelectric elements to expel ink through the apertures in the chemically etched print plates to form the image on the imaging member 22 as the member rotates past the print head 20. As another example, these control signals drive the sensor array 50, causing the sensor array to scan imaging member 22 and move between the scan position and the shielded position.

Figure 2:
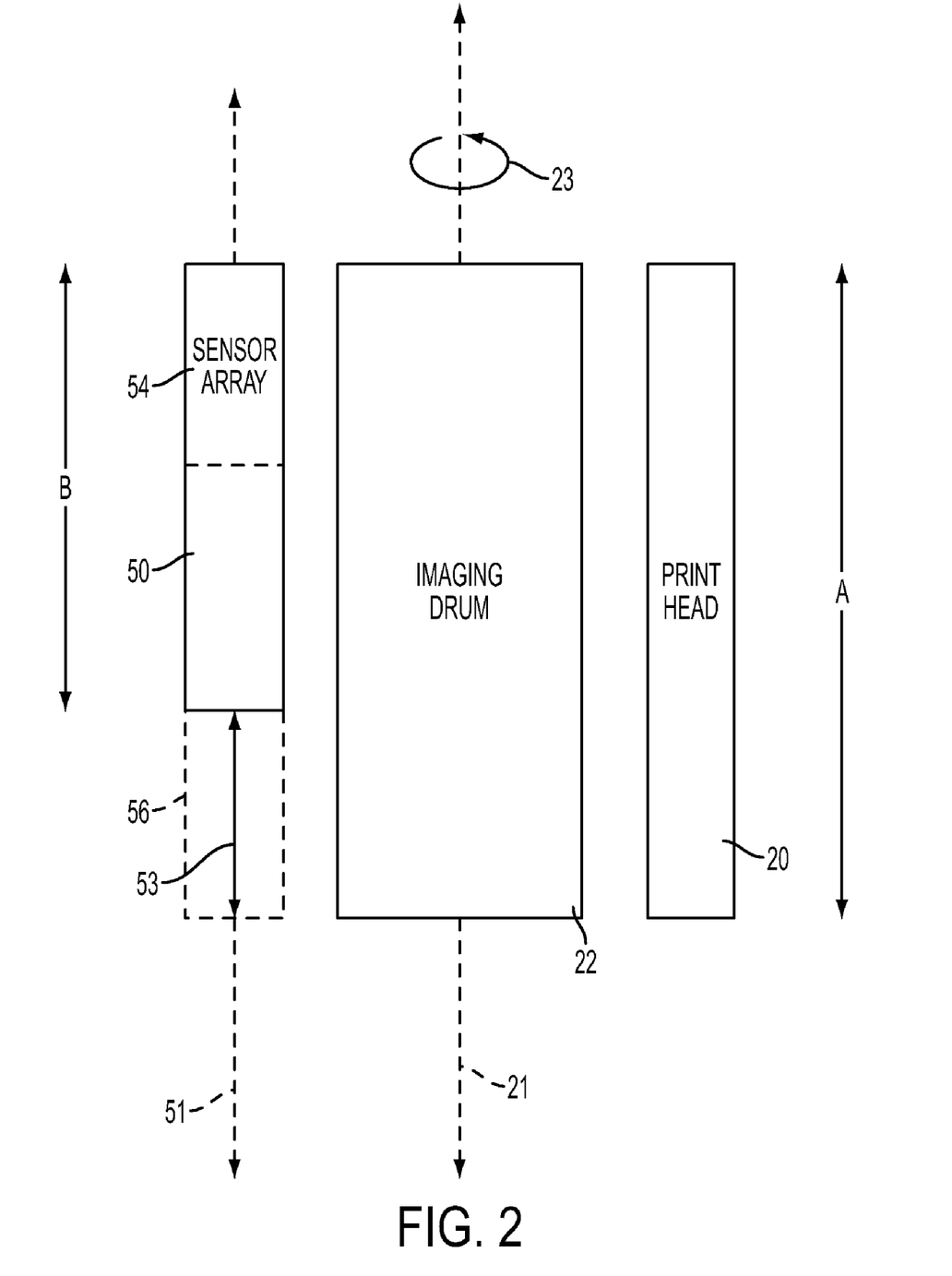
FIG. 2 shows a plan view representing the sensor array, imaging member and print head in the printing system of FIG. 1 and showing the movement of the sensor array along a sensor axis.

FIG. 2 shows a plan view of the arrangement of the print head 20, imaging member 22, and sensor array 50 within the printer 10. In the embodiment of FIG. 2, the imaging member 22 is an imaging drum having a length A. The print head 20 is substantially the same length A. Because the print head 20 is substantially the same length as the imaging drum 22, the print head 20 is configured to deliver marking material to the entire surface of the imaging drum (or nearly the entire surface) as the imaging drum 22 rotates about drum axis 21, as indicated by arrow 23. The rotational direction 23 of the imaging drum 22 is also referred to herein as the process direction 23 of the imaging drum 22. In at least one embodiment, the imaging drum 22 has a length of at least eleven inches. With an imaging drum 22 of at least this size, the printer is capable of handling sheets of paper of "ledger" or greater size, provided such sheets are oriented with the shorter side of the sheet as a leading edge as the sheet moves through the printer.

The sensor array 50 is shown in FIG. 2 in a scan position such that the photo detectors on the sensor array are arranged and oriented to detect light reflected from or otherwise emanating from the imaging drum 22. The sensor array has a length B which is substantially shorter than the length A. In at least one embodiment, the sensor array 50 is a standard contact image sensor (CIS) of eight and one-half inches in length (i.e., B=8.5"). Such sensor arrays are commonly available from various manufacturers and are relatively inexpensive compared to longer sensor arrays.

Because the sensor array 50 has a length that is shorter than that of the imaging drum 22, the sensor array 50 is not equipped to scan the entire imaging drum or an image that extends across the substantial length of the imaging drum in a single rotation of the imaging drum. In order to accomplish scanning of the entire imaging drum 22, the sensor array 50 is configured to move relative to the imaging drum 22 between a first position where the sensor array 50 is in position to scan a left side of the imaging drum 22 and a second position where the sensor array 50 is in position to scan a right side of the imaging drum 22. In the embodiment of FIG. 2, the sensor array 50 is shown in solid lines in the first position 54 and the dotted lines 56 indicate a second position where the sensor array may be moved. The photo detectors of the sensor array 50 are substantially aligned along an axis 51 of the sensor array. As can be seen in FIG. 2, the axis 51 of the sensor array is substantially parallel to the surface of the imaging drum 22 (and axis 21) and is substantially perpendicular to the process direction 23 of the imaging drum 22. When the sensor array 50 moves from the first position 54 to the second position 56, the photo detectors of the sensor array move along the axis 51 of the sensor array.

Figure 3:
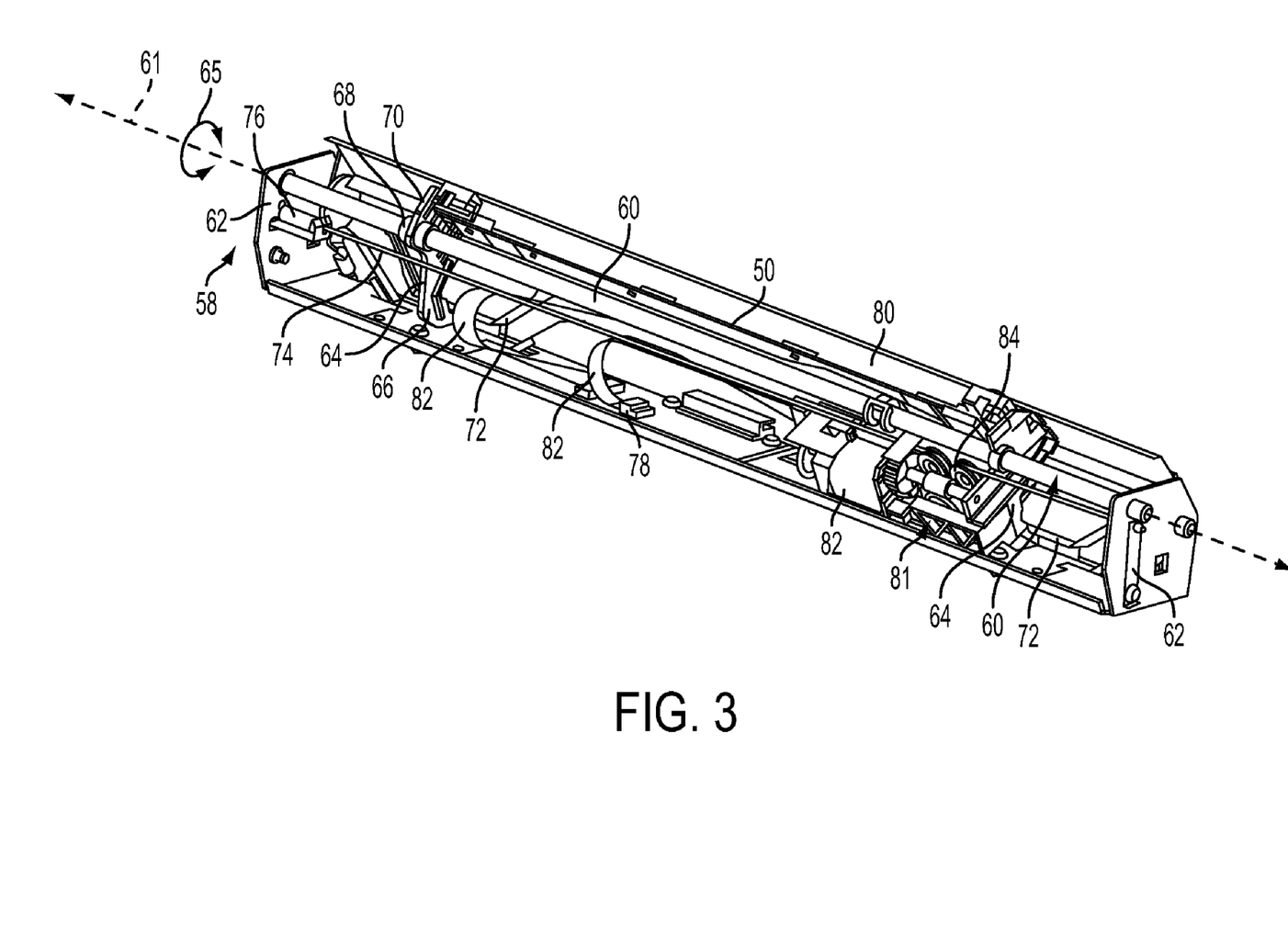
FIG. 3 shows a first perspective view of one embodiment of a mechanism for moving the sensor array in the printing system of FIG. 1 using a cable and shuttle drive.
Figure 4:
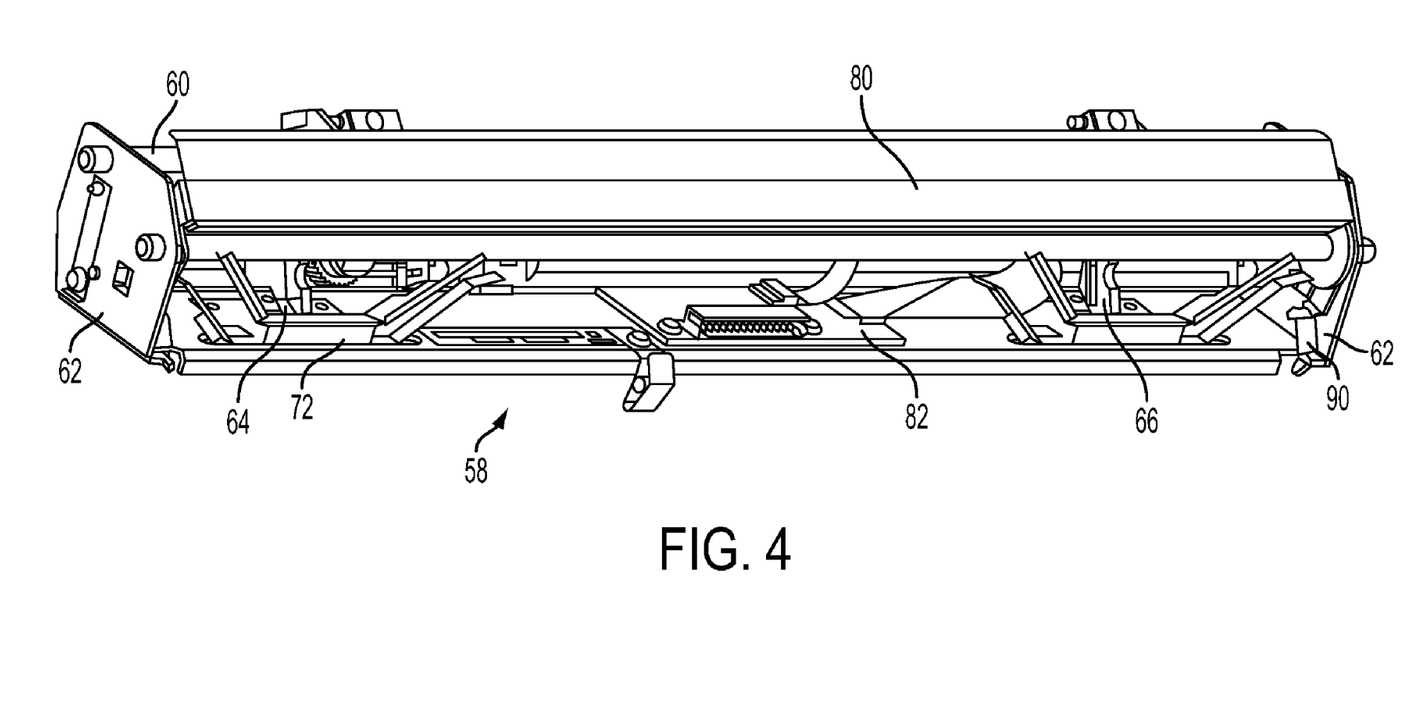
FIG. 4 shows a second perspective view of the embodiment of the mechanism for moving the sensor array of FIG. 3.

With reference now to FIGS. 3 and 4, a first embodiment of a mechanism for moving the sensor array 50 along the sensor axis between the first position and the second position is shown. The mechanism comprises a stationary frame 58 with a guide rod 60 extending between two end plates 62. A drive cable 74 also extends between the two end plates 62. One end of the drive cable 74 is secured to the end plate 62 with a tension spring 76. Two guide tracks 72 are fixed to a floor of the frame 58. Electrical connectors 78 are also secured to the floor of the frame 58. Electric cables 88 extend from the connectors to the sensor array 50 and to an electric motor 82. A pivotable cover shield 80 extends across the upper portion of the frame 58. A cover return spring 90 biases the cover shield 80 toward a shielded position where the cover shield 80 blocks the sensor array 50 from the imaging drum 22.

With continued reference to FIGS. 3 and 4, two guide track followers 64 are slideably positioned upon the guide rod 60. Each guide track follower 64 includes a bearing member 68, a sensor array mount 70, and a foot 66. The mount 70 is fixedly secured to the sensor array 50 such that the sensor array 50 moves along with the guide track follower 64. The bearing member 68 allows the guide track follower 64 to slide on the guide rod 60 and also pivot about a guide rod axis 61, as indicated by arrow 65. The foot 66 of each guide track follower 64 extends downward from the bearing member 68 and engages one of the guide tracks 72.

Each guide track 72 comprises a channel formed between an upper bracket and a lower bracket. The brackets each include a flat center portion positioned between two upwardly rising end ramps. The foot 66 of each guide track follower 64 extends into the channel of a guide track 72 and is configured to slide laterally within the channel. When the foot 66 of a guide track follower 64 engages one of the ramped end portions, the guide track follower 66 is made to pivot about the guide rod 60 as the follower 64 slides up the ramped portion.

A shuttle 81 is connected to one of the guide track followers 64. The shuttle 81 carries an electric motor 82. The electric motor 82 powers a drive train and a drive wheel (not shown) that engages the drive cable 74. Two tension wheels 84 are provided adjacent to the drive wheel. The tension wheels 84 direct the drive cable 74 such that it wraps around the drive wheel. In the embodiment of FIGS. 3 and 4 the drive cable 74 is provided as part of a positive drive arrangement including a cable. However, it will be recognized that in other embodiments the positive drive could be substituted for other drive arrangements such as a toothed or cogged belt drive, a synchromesh cable, or a friction drive.

The mechanism shown in FIGS. 3 and 4 provides an arrangement that moves the sensor array between multiple positions parallel to the axis 61. In particular, when the electric motor 82 rotates the drive wheel, the shuttle 81 is moved along the drive cable 74 and the guide track followers 64 slide along the guide rod 60. At the same time, the sensor array 50, which is mounted on the guide track followers 64, is also moved parallel to the drive axis 61.

As mentioned previously, when the guide track followers 64 engage the ramped portions of the guide tracks 72, the guide track followers pivot about axis 61. This pivoting action also causes the sensor array 50 to pivot about axis 61. When the guide track followers are in the center position of the guide tracks, the sensor array 50 is in a shielded position and removed from the imaging drum 22 (see, e.g., position 52 in FIG. 1). In this shielded position, the shield cover 80 blocks the sensor array 50 and protects it from contamination. However, when the guide track followers 64 engage the ramps on the end portions of the guide tracks 72, the guide track followers 64 pivot about the axis 61, and move the sensor array 50 toward a scan position that is closer to the imaging drum 22. When the sensor array 50 is moved to the scan position, it pushes the cover 80 out of the way and exposes the sensor array 50 to the imaging drum. When in the scanning position, the sensor array 50 is held at a proper distance from the imaging drum such that it is in focus for image capture. Thereafter, movement of the followers 64 down the ramps of the guide tracks 74 and back to the center position causes the sensor array 50 to rotate back to the shielded position. As the sensor array 50 moves back to the shielded position, the spring biased shield cover 80 automatically returns to a blocking position to protect the sensor array 50 from contamination.

Figure 5:
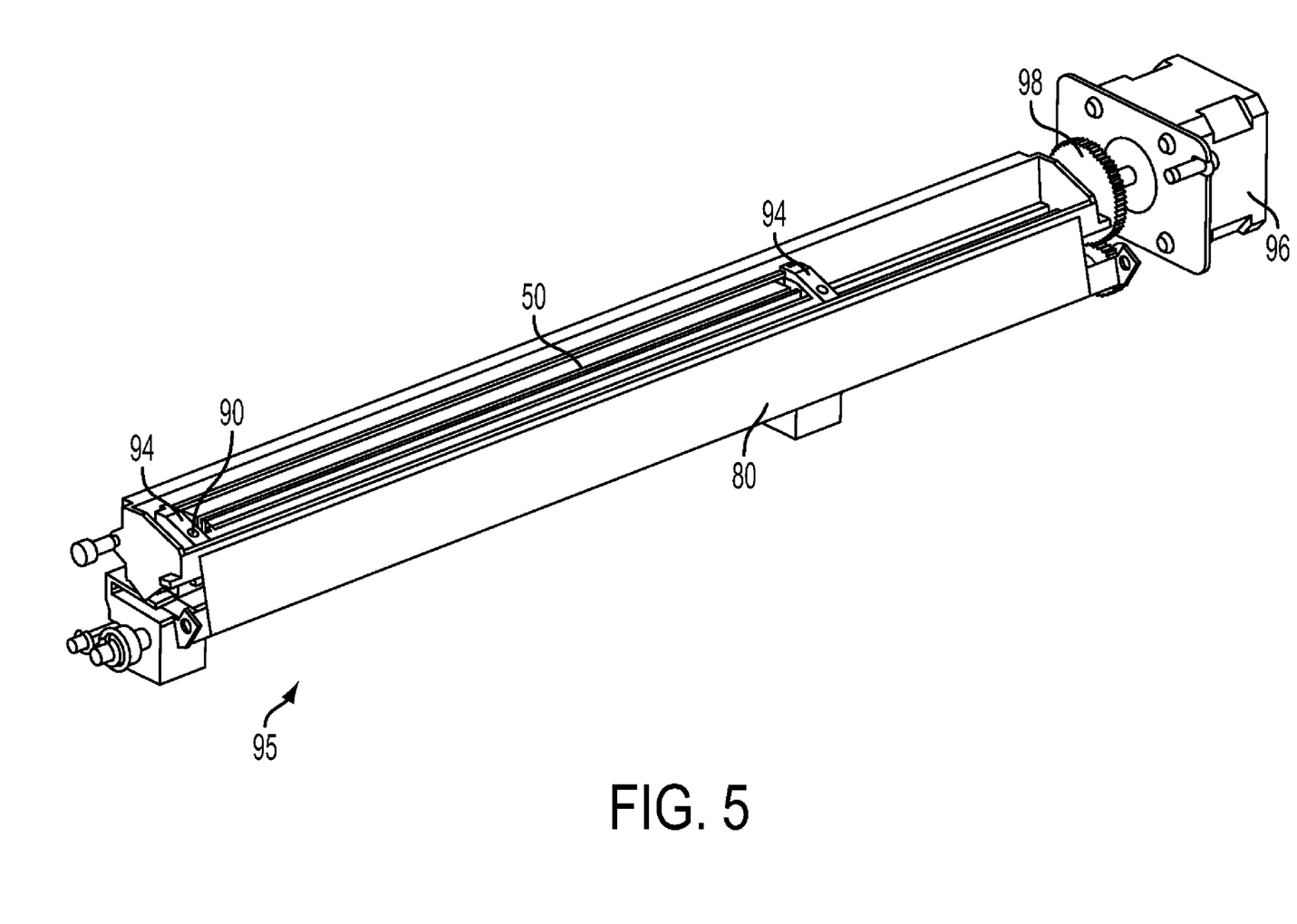
FIG. 5 shows a first perspective view of another embodiment of a mechanism for moving the sensor array in the printing system of FIG. 1 using a threaded screw and nut drive.
Figure 6:
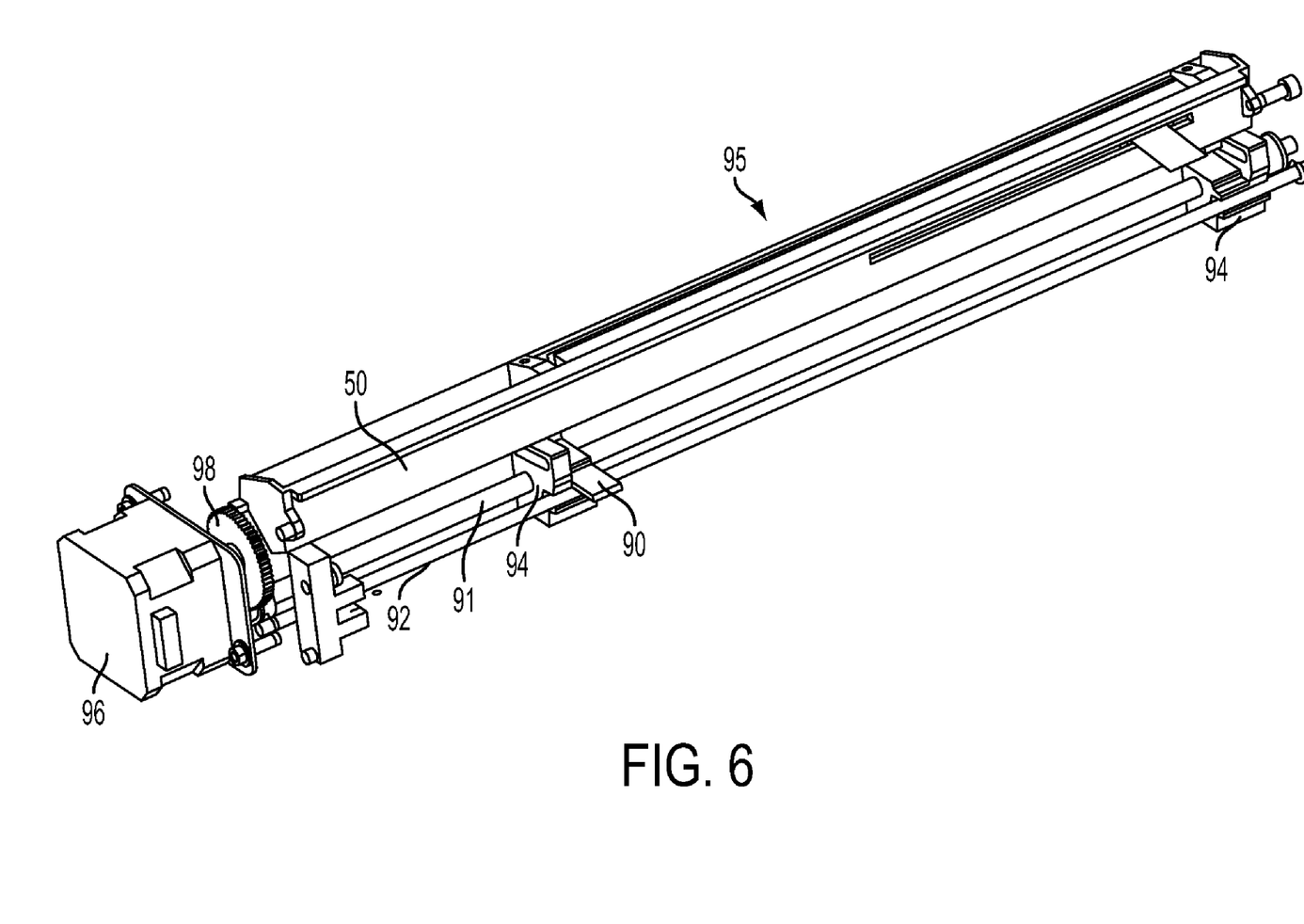
FIG. 6 shows a second perspective view of the embodiment of the mechanism for moving the sensor array of FIG. 5.

With reference now to FIGS. 5 and 6 an alternative embodiment of a mechanism 95 for moving the sensor array 50 is shown. In the embodiment of FIGS. 5 and 6, the sensor array is attached to two mounts 90 configured to follow a threaded screw 91 and guide rod 92. Each mount 90 includes a threaded nut portion 94 that engages the threaded screw 91. An electric motor encased within housing 96 is configured to drive a gear train 98 which, in turn, is configured to rotate the threaded rod 92. The parts that hold the sensor array 50 on the mount 90 include features that move the sensor array into either the shielded or scanning positions. For example, the sensor array may be retained on the mounts by slideable arms (not shown) that engage a guide track. The slideable arms cause the sensor array to move between the scan position and the shielded position as the mounts 90 move along the guide rod 92. The cover 80 is biased against the sensor array 50 and blocks the sensor array from the imaging drum 22 when the sensor array is in the shielded position. When the sensor array 50 is moved to the scan position, the cover 80 is forced out of the way, exposing the sensor array to the imaging drum 22.

While various embodiments of the mechanism for moving the sensor array along the axis 51 are shown in FIGS. 3-6, it will be recognized that numerous other embodiments are available for achieving the same purpose. For example, linear actuation could also be accomplished by air or hydraulic cylinders or with a solenoid, as will be recognized by those of skill in the art. In addition, other embodiments for actuation of the shield will be recognized, such as moving the shield with an electric solenoid or motor. Furthermore, it will be recognized that the sensor array and mechanism for moving the sensor array could be built into the printer as an integral part or could be designed as an easily replaceable module in the printer.

In operation, the moveable sensor array 50 may be used to evaluate an image printed on the imaging drum 22. To accomplish this, the sensor array 50 is first moved to the scan position and situated to one side of the imaging drum and focused on such side (e.g., a left side position). The imaging drum 22 is then rotated such that the image on the drum passes by the stationary sensor array 50. If the image is larger than 8.5 inches in width, the sensor array 50 does not capture the entire image in a single pass, and the sensor array must be shifted along the axis 51 to a second position 56 on an opposite side of the imaging drum (e.g., a right side position) and focused on such side. This movement of the sensor array allows it to refocus on the portion of the imaging drum that was previously missed and thus allows the sensor array to capture the entire image. Accordingly, once the sensor array is moved to the second position, the drum 22 is rotated again to allow the sensor array to scan the remaining portion of the image as the drum 22 passes by the stationary sensor array. Once the entire image has been scanned using the sensor array 50, firmware on the main board 36 of the printer is used to evaluate the image.

Before the sensor array 50 is used to scan an image, it is first calibrated in order to normalize the pixel-to-pixel variation relative to a grey-level reference. In the disclosed embodiment, the calibration reference is the surface of the imaging drum 22, which may also be the same surface where the test image for evaluation will be printed. Similar to image scanning, calibration also involves scanning the drum 22 with the sensor array in both the first position and the second position in order to cover the entire drum.

During calibration of the sensor array 50, there is a risk that some form of contamination may exist, such as dust or other debris, on the sensor array or the drum. There is also the chance that a photo detector of the sensor array 50 is faulty and incapable of properly scanning the image. The existence of such contamination or a faulty photo detector will result in a distorted signal for one or more pixels and cause a calibration failure or incorrect calibration. In the embodiment of the printer disclosed herein, if contamination (or a faulty pixel) exists on either the imaging drum 22 or on the sensor array 50, the result is evidenced by large scale-factor values when calibration is completed by the firmware residing on the main board 36 of the printer. In particular, the calibration firmware analyzes final calibration scale-factors and determines if a scale-factor value exceeds a limit value. If the scale-factor value does exceed a limit value, a fault is declared by firmware. Such a fault condition prevents a poor calibration from causing an erroneous measurement during subsequent image evaluation. In these situations, the moveable sensor array 50 may also be used to determine whether the source of the fault is the imaging drum 22 or the photo sensors. Based on the source of the fault, appropriate action may be taken to remove the contamination.

Figure 7:
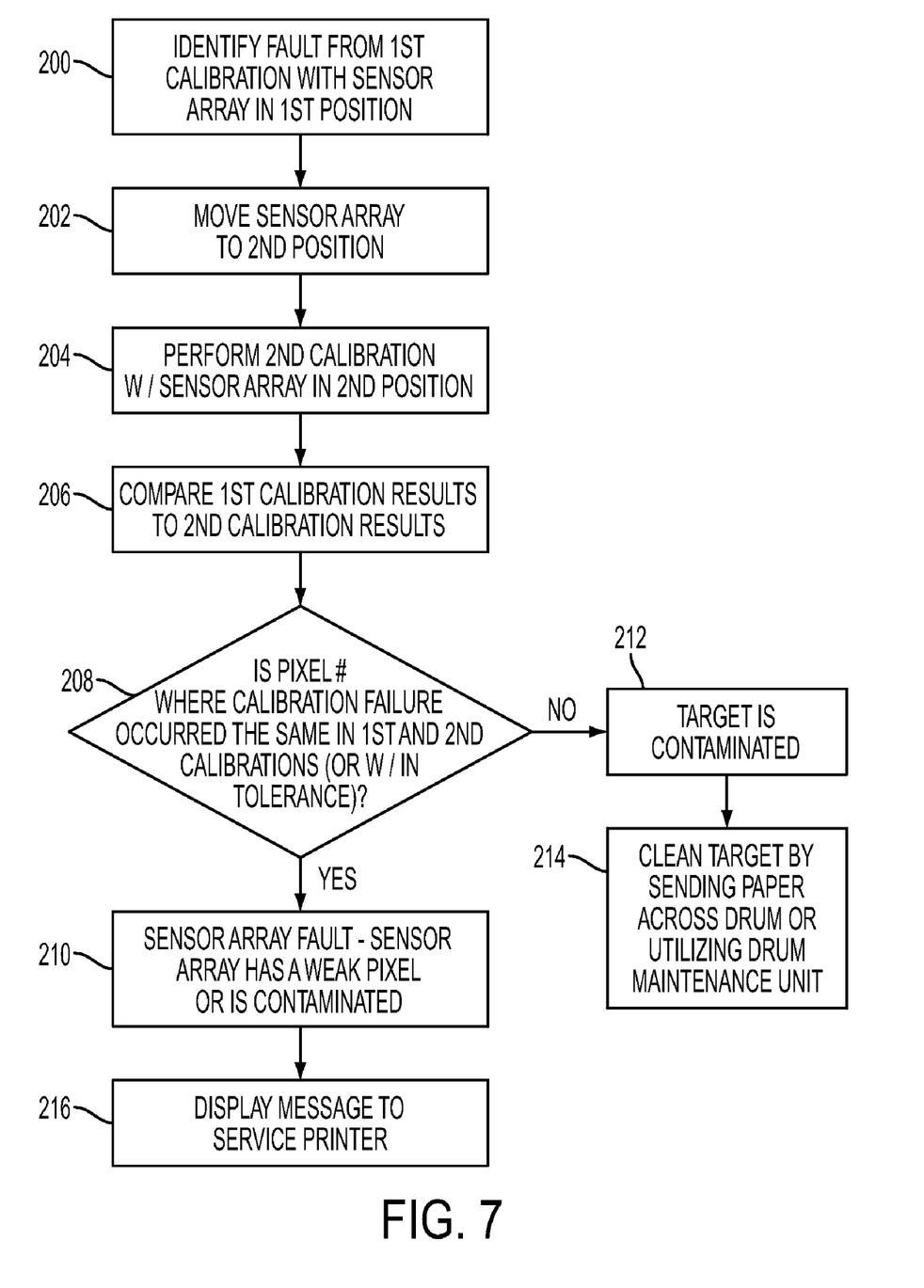
FIG. 7 shows a flowchart of a method of determining a calibration fault using the moveable sensor array of FIG. 1.

With reference now to FIG. 7, a flowchart is shown disclosing a method of determining a location where contamination exists following calibration of the moveable sensor array 50. The method begins with step 200 when a fault condition is declared following a first calibration of the sensor array with the sensor array in a first calibration position. As discussed previously, the fault condition indicates that some form of contamination is present on either the sensor array 50 or the imaging drum 22 or that a weak photosensor exists on the sensor array.

As indicated in step 202 of FIG. 7, once the fault condition is declared, the sensor array 50 is moved a distance along the sensor axis 51 to a second calibration position. The distance the sensor array 50 is moved in step 202 may be relatively small, such as an inch, but should be at least a distance equal to that of several pixels. In at least one embodiment, the distance of movement of the sensor array from the first calibration position to the second calibration position should not be so great that the sensor array is completely removed from the potential contamination location on the imaging drum. For example, if the initial calibration results indicate that a potential contamination location is two inches from the edge of the imaging drum 22, the second calibration position should also be a position where the sensor array is in position to scan the imaging drum 22 at two inches from the edge of the imaging drum. However, in another embodiment, the sensor array 50 may actually be moved to a second position such that the potential contamination location is outside the imagable area of the sensor array. As will be recognized, because the sensor array output in the first position is compared to the sensor array output in the second position (as described in further detail below), a change in the sensor array output in this situation still allow the system to determine if there is contamination on the target or if the sensor array is faulty or contaminated.

After movement of the sensor array to the second calibration position in step 202, a second calibration of the imaging drum 204 is performed in step 204. If there is a problem with the imaging drum or the sensor array, this second calibration should also result in a fault condition that once again indicates contamination or a faulty pixel.

Next, in step 206 of FIG. 7, the processor on the main board 36 compares the results from the first calibration to those of the second calibration. In step 208 a determination is made whether the pixel number where the failure occurred in the second calibration is the same (or within some tolerance) as the pixel number where the fault occurred in the first calibration.

As indicated in step 210 of FIG. 7, if the pixel number is the same or within the tolerance, it can be assumed that the sensor array is contaminated or has a weak pixel. For example, if the first calibration showed contamination at pixels 25 and 26, and the second calibration showed contamination at pixels 26 and 27, it can be assumed that contamination (or a defective pixel) exists on the sensor array and that such contamination (or defective pixel) moved with the sensor array 50 when the sensor array was moved along the sensor axis from the first calibration position to the second calibration position. On the other hand, as indicated in step 212, if the pixel number is not the same or within the tolerance, it can be assumed that the imaging drum is contaminated and that the sensor array is fine. For example, if the first calibration showed a fault at pixels 25 and 26, and the second calibration showed a fault at pixels 50 and 51, it can be assumed that contamination exists on the imaging drum and did not move along with the sensor array when the sensor array was moved along the sensor axis. Instead, in this situation, the contamination on the imaging drum showed up at different pixels when the sensor array was moved along the sensor axis from the first calibration position to the second calibration position.

Once the source of the contamination or faulty pixel is determined, the printer may take appropriate action to recover from the problem. If it is determined that the imaging drum is contaminated, the printer may take action in step 214 to clean the imaging drum. For example, sheets of paper or other media may be automatically sent through the printer as commanded by the firmware with the expectation that the contamination on the drum would be transferred to the media which would then exit the printer. Another exemplary method for cleaning the drum in solid ink jet printers would be to use the drum maintenance unit 24 to remove contamination from the drum. Yet another alternative would be to use a special cleaning blade, wiper, or other device that could remove contamination from the drum or other target.

If it is determined in steps 208 and 210 that the contamination exists on the sensor array or that a faulty photo detector exists on the sensor array, the problem is likely to be more difficult to correct. Thus, as indicated in step 216, when the fault is with the sensor array the printer will display a message or otherwise indicate that the printer should be serviced by a technician. However, in at least one embodiment, a mechanism may be provided for attempting to remove contamination from the sensor array before the message is displayed to service the printer. For example, a brush could be passes over the sensor array or an air blast could be directed at the sensor array in an attempt to remove contamination. After this, the system could be re-calibrated. If the contamination/faulty sensor error re-appeared in the next calibration, a message to service the printer could then be displayed.

In at least one alternative embodiment, if a determination is made that one or more photo sensors are faulty or contaminated, the printer may still be utilized without the need for a service call or other cleaning of the sensor array 50. In such a situation when the sensor array is used to scan a target, it is known that the sensor array will always indicate a distorted sample at a particular location on the target. Thus, to confirm whether or not a distortion actually exists on the target at such location, the sensor array may simply be moved to allow working/non-contaminated photo sensors to rescan this portion of the target. If the rescan indicates no contamination on that portion of the target, it is known that the target is not distorted, and the printer may still be used without the need to service the printer before further use.

While FIG. 7 discloses one embodiment for using the moveable sensor array to determine the location of a calibration fault, additional methods are also possible. For example, in one alternative embodiment, a check could be performed to determine whether the failure occurs in all colors or just in specific colors. This would give additional information regarding the location of the contamination. A fault indication with all colors would tend to indicate a weak sensor array pixel or contamination on the array itself. A fault indication with only a single color would most likely indicate a contaminated target.

In addition to the above, it will be recognized that although a linear sensor of some appreciable length (e.g., 8.5 inches) is shown in the figures and described for use with the embodiments disclosed herein, other significantly shorter sensor arrays are also possible. For example, the term "sensor array" could encompass an arrangement where a single chip is utilized with a number of photo sensors on the single chip (e.g., a single chip of a centimeter or less in length). In such an embodiment, a reductive lens may be placed in front of the at least one photo sensor or chip to cover a given portion of the imaging drum or other target. In such an embodiment, the chip could be moved to multiple positions along the scan axis. Alternatively, two or more fixed reductive lenses may be provided next to each other, each for one portion of the drum length, and the single chip could be moved in front of the fixed reductive lenses to focus the photo sensor(s) on the appropriate portion of the drum or other target. In yet another embodiment, the at least one photo sensor or chip may held in one place and the reductive optics may be moved, with each set of optics focusing the photo sensor(s) on different areas of the drum.

Although the various embodiments have been provided herein, it will be appreciated by those of skill in the art that other implementations and adaptations are possible. Furthermore, aspects of the various embodiments described herein may be combined or substituted with aspects from other features to arrive at different embodiments from those described herein. Thus, it will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is

1. A printing device comprising:
   a print head configured to deliver marking material to a target moving in a process direction;
   a sensor array comprising a plurality of photo sensors, the sensor array being configured to move between a first position and a second position on a sensor axis and to scan one side of the target when in the first position and scan an opposite side of the target when in the second position, the plurality of photo sensors of the sensor array defining the sensor axis, which is substantially perpendicular to the process direction; and
   a controller configured to:
      perform a first calibration of the sensor array in the first position,
      move the sensor array from the first position to the second position in response to a fault being detected during the first calibration of the sensor array,
      perform a second calibration of the sensor array in the second position, and
      determine whether a source of the fault is the target or the sensor array
   following the second calibration.

2. The printing device of claim 1 wherein the wherein the length of the sensor array is substantially less than the length of the target along an edge of the target that is substantially perpendicular to the process direction.

3. The printing device of claim 2 wherein the target is an imaging drum.

4. The printing device of claim 3 wherein the length of the sensor array is about eight and one-half inches and the length of the imaging drum is greater than eleven inches.

5. The printing device of claim 2 wherein the target translates perpendicular to the sensor axis.

6. The printing device of claim 1, the sensor array being further configured to move between a scan position and a shielded position, the sensor array being closer to the target in the scan position than in the shielded position, and the sensor array being configured to scan the target in the scan position.

7. A method of determining a fault location in a printing device comprising:
   performing a first calibration of a sensor array relative to a reference member with the sensor array in a first position;
   detecting a fault during the first calibration of the sensor array;
   moving the sensor array from the first position to a second position;
   performing a second calibration of the sensor array relative to the reference member with the sensor array in the second position;
   determining whether a source of the fault is the reference member or the sensor array based on the first calibration and the second calibration.

8. The method of claim 7 wherein the sensor array comprises a plurality of photo sensors defining a sensor axis.

9. The method of claim 7 wherein moving the sensor array from the first position to the second position comprises moving the sensor array along the sensor axis during movement from the first position to the second position.

10. The method of claim 7 wherein determining whether the source of the fault is the reference member or the sensor array is based on a comparison of results from the first calibration with results of the second calibration.

11. The method of claim 7 wherein the reference member is an unmarked imaging member.

12. The method of claim 11 further comprising cleaning the unmarked imaging member if it is determined that the source of the fault is the imaging member.

13. The method of claim 12 wherein cleaning the unmarked imaging member comprises bringing print media into contact with the imaging member.

14. The method of claim 7 wherein the reference member is a rotatable imaging drum and wherein the sensor array scans the imaging drum during the first calibration and the second calibration.

* * * * *